(12) United States Patent
Jelinek et al.

(10) Patent No.: US 11,043,384 B2
(45) Date of Patent: Jun. 22, 2021

(54) METHOD OF MANUFACTURING A SEMICONDUCTOR DEVICE BY USING ION BEAM TECHNIQUE

(71) Applicant: Infineon Technologies AG, Neubiberg (DE)

(72) Inventors: Moriz Jelinek, Villach (AT); Michael Kokot, Dresden (DE); Christian Krueger, Liegau-Augustusbad (DE); Hans-Joachim Schulze, Taufkirchen (DE); Werner Schustereder, Villach (AT)

(73) Assignee: Infineon Technologies AG, Neubiberg (DE)

( * ) Notice: Subject to any disclaimer, the term of this patent is extended or adjusted under 35 U.S.C. 154(b) by 23 days.

(21) Appl. No.: 16/432,211

(22) Filed: Jun. 5, 2019

(65) Prior Publication Data

US 2019/0385852 A1  Dec. 19, 2019

(30) Foreign Application Priority Data

Jun. 15, 2018   (DE) .......................... 102018114436.9

(51) Int. Cl.
| | | |
|---|---|---|
| *H01L 21/04* | (2006.01) | |
| *H01L 21/265* | (2006.01) | |
| *H01L 21/66* | (2006.01) | |
| *H01L 29/06* | (2006.01) | |
| *H01L 29/10* | (2006.01) | |
| *H01L 29/36* | (2006.01) | |
| *H01L 21/687* | (2006.01) | |

(52) U.S. Cl.
CPC .. *H01L 21/26513* (2013.01); *H01L 21/68764* (2013.01); *H01L 22/26* (2013.01); *H01L 29/0619* (2013.01); *H01L 29/1079* (2013.01); *H01L 29/36* (2013.01)

(58) Field of Classification Search
CPC ... H01L 21/047; H01L 21/265; H01L 21/425; H01L 23/5254; H01L 23/5258
See application file for complete search history.

(56) References Cited

U.S. PATENT DOCUMENTS

| | | |
|---|---|---|
| 6,229,148 B1 | 5/2001 | Prall et al. |
| 2003/0224612 A1 | 12/2003 | Merrett et al. |

(Continued)

FOREIGN PATENT DOCUMENTS

DE   102015115173 A1   3/2017

OTHER PUBLICATIONS

Laska, T., et al., "Ultrathin-Wafer Technology for a New 600V-NPT-IGBT", Proc. of 9th International Symposium on Power Semiconductor Development and IC's (ISPSD), 1997, pp. 361-364.

(Continued)

*Primary Examiner* — Hoai V Pham
(74) *Attorney, Agent, or Firm* — Murphy, Bilak & Homiller, PLLC

(57) ABSTRACT

A method of manufacturing a semiconductor device includes reducing a thickness of a semiconductor substrate and/or forming a doped region in the semiconductor substrate. The method further includes changing an ion acceleration energy of an ion beam while effecting a relative movement between the semiconductor substrate and the ion beam impinging on the semiconductor substrate.

20 Claims, 8 Drawing Sheets

(56) References Cited

U.S. PATENT DOCUMENTS

2012/0248324 A1* 10/2012 Eisner .................. H01J 37/302
                                                        250/396 ML
2015/0371858 A1    12/2015 Laven et al.
2019/0066977 A1*  2/2019 Jelinek .............. H01L 21/26546

OTHER PUBLICATIONS

Ryssel, Heiner, et al., "Ion Implantation", B.G. Teubner Stuttgart; 1st Edition, 1978, pp. 124-129; English Translation attached.

* cited by examiner $$V^E_{target} = dE/dt_{target} / I_{B,expected}$$
$$V^E_{feedback} = dE/dt_{set} / I_{B,meas}$$

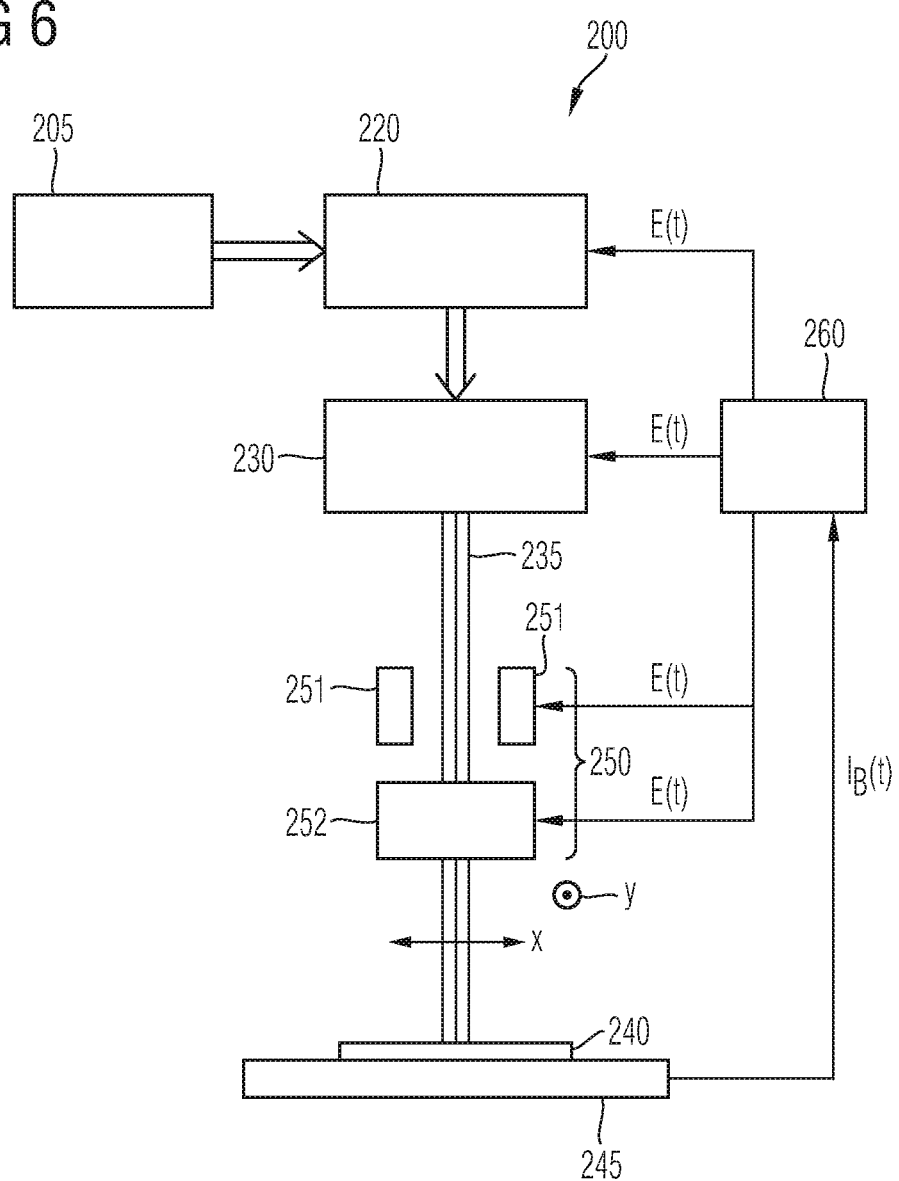

US 11,043,384 B2

METHOD OF MANUFACTURING A SEMICONDUCTOR DEVICE BY USING ION BEAM TECHNIQUE

BACKGROUND

Some parameters of semiconductor devices can be linked to properties of vertical dopant profiles. For example, vertical power semiconductor devices that control a load current flow between a first load electrode at a front side and a second load electrode at a rear side of a semiconductor die include doped regions such as drift zone, compensation structures, buffer layers and field stop layers with specific vertical dopant profiles, wherein parameters of the vertical dopant profiles of these layers such as uniformity, smoothness and undulation may have substantial impact on device parameters. Compared to in-situ doping during layer deposition, ion implantation allows for precisely monitoring both total dose and dose rate. Ion implantation typically leads to a Gaussian-like distribution of the dopants around an end-of-range-peak which distance to a substrate surface is a function of an ion acceleration energy of the implanted ions. Formation of doping profiles having a small degree of undulation, for example box-like or triangular doping profiles may be limited by constraints of process technology, for example by a limited thermal budget for rear side processes in view of finished front side structures or by end of range peaks of proton implantations.

There is a need for an improved method of manufacturing a semiconductor device.

SUMMARY

The present disclosure relates to a method of manufacturing a semiconductor device. The method includes reducing a thickness of a semiconductor substrate. The method further includes changing an ion acceleration energy of an ion beam while effecting a relative movement between the semiconductor substrate and the ion beam impinging on the semiconductor substrate.

The present disclosure further relates to another method of manufacturing a semiconductor device. The method includes forming a doped region in a semiconductor substrate. Thereafter, the method further includes changing an ion acceleration energy of an ion beam while effecting a relative movement between the semiconductor substrate and an ion beam impinging on the semiconductor substrate.

The present disclosure further relates to a semiconductor device including a semiconductor substrate. The semiconductor device further includes a field stop zone in the semiconductor substrate, wherein a doping concentration profile of the field stop zone is determined by a concentration profile of hydrogen-related donors. A Full Width at Half Maximum, FWHM, of at least one peak in the concentration profile of the hydrogen related donors of the field stop zone is larger than 5 µm.

Further embodiments are described in the dependent claims. Those skilled in the art will recognize additional features and advantages upon reading the following detailed description and on viewing the accompanying drawings.

BRIEF DESCRIPTION OF THE DRAWINGS

The accompanying drawings are included to provide a further understanding of the present embodiments and are incorporated in and constitute a part of this specification. The drawings illustrate the present embodiments and together with the description serve to explain principles of the embodiments. Further embodiments and intended advantages will be readily appreciated as they become better understood by reference to the following detailed description.

FIG. 6 is a schematic illustration of an ion implantation apparatus based on electrostatic scanning along first and second scan directions.

DETAILED DESCRIPTION

In the following detailed description, reference is made to the accompanying drawings, which form a part hereof and in which are shown by way of illustrations specific embodiments in which the embodiments may be practiced. It is to be understood that other embodiments may be utilized and structural or logical changes may be made without departing from the scope of the present disclosure. For example, features illustrated or described for one embodiment can be used on or in conjunction with other embodiments to yield yet a further embodiment. It is intended that the present disclosure includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude additional elements or features. The articles "a", "an" and "the" are intended to include the plural as well as the singular, unless the context clearly indicates otherwise.

Figure 1:
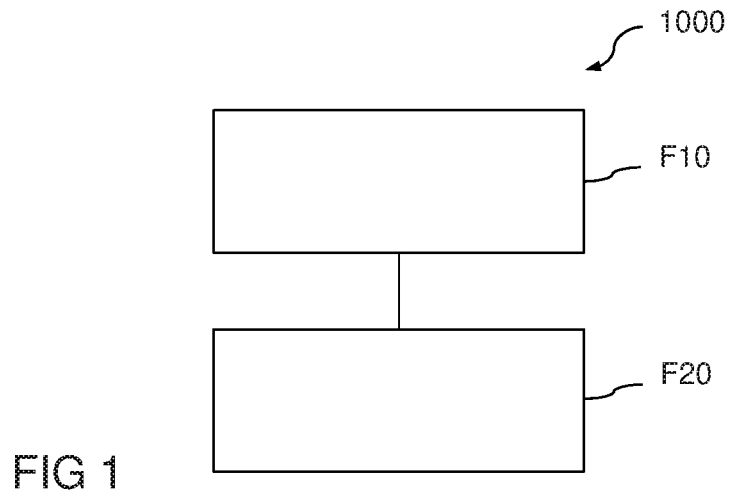
FIG. 1 is a simplified flow-chart for illustrating a method of manufacturing a semiconductor device.

FIG. 1 is a schematic flow-chart for illustrating a method 1000 for manufacturing a semiconductor device.

It will be appreciated that while method 1000 is illustrated and described below as a series of steps or events, the illustrated ordering of such steps or events are not to be interpreted in a limiting sense. For example, some steps may occur in different orders and/or concurrently with other steps or events apart from those illustrated and/or described herein. In addition, not all steps may be required to implement one or more aspects of embodiments of the disclosure herein. Also, one or more of the steps depicted herein may be divided in one or more separate sub-steps and/or phases.

Referring to FIG. 1, process feature F10 comprises reducing a thickness of a semiconductor substrate. The semiconductor substrate may be a semiconductor wafer or a semiconductor die or chip sliced from a semiconductor wafer. The semiconductor substrate may include a semiconductor wafer having none, one or more optional epitaxial layers thereon. The semiconductor substrate may also include one or more doped semiconductor regions formed therein. The semiconductor substrate may be a silicon semiconductor substrate, for example a Czochralski (CZ) silicon semiconductor substrate such as a magnetic Czochralski (MCZ) silicon semiconductor substrate, or a Float-Zone (FZ) silicon semiconductor substrate, for example. In some embodiments, a material of the semiconductor substrate is another single-crystalline semiconductor material such as silicon carbide (SiC), gallium arsenide (GaAs), gallium nitride (GaN) or another $A_{III}B_V$ semiconductor, germanium (Ge) or a silicon germanium (SiGe).

Referring to FIG. 1, reducing a thickness of the semiconductor substrate may be carried out by removing material of the semiconductor substrate from a surface at a second side, for example rear side of the semiconductor body opposite to a surface at a first side, for example front side. In one or more embodiments, the semiconductor substrate is mechanically supported by a carrier attached to the surface at the first side. Material of the semiconductor substrate may be removed by chemical processes, for example by etching such as dry or wet etching, mechanical processes, for example abrasive machining such as grinding or polishing, and chemical-mechanical processes such as chemical-mechanical polishing (CMP). In one or more embodiments, a combination of more than one process for removing material of the semiconductor substrate may be used, for example a first process having a greater material removal rate than a second process following the first process. This may allow for a fine-adjustment of a target wafer thickness, for example. The process for removing material of the semiconductor substrate from the second surface may also include the so-called TAIKO process. The TAIKO process is a wafer thinning process in which an outer support ring along the edge of the wafer is not thinned during the thinning process. The outer support ring may provide improved thin wafer handling during subsequent processing. For example, wafers that are thinned using the TAIKO process can typically maintain their rigidity without being attached to an additional carrier.

Referring to FIG. 1, process feature F20 comprises changing an ion acceleration energy (also referred to as ion implantation energy) of an ion beam while effecting a relative movement between a semiconductor substrate and the ion beam impinging on a surface of the semiconductor substrate. Hence, the ion acceleration energy, for example determined by an ion acceleration voltage of an ion acceleration unit, is altered during a single ion implantation process. A single ion implantation process is an ion implantation process that is based on a single implant recipe and is not interrupted by a tuning period for changing the implant recipe, for example. In other words, during a single ion implantation process, an ion beam is continuously directed on a target, for example a wafer, i.e. the ion beam is not temporally interrupted for tuning purposes. The ion beam may include ions, for example, protons, helium or ions with an atomic number greater 4, for example ions of nitrogen, aluminum, boron, phosphorus, arsenic, sulfur, selenium, germanium, antimony, or oxygen. In one or more embodiments, changing the ion acceleration energy may be subject to a closed-loop control process. Process feature F20 may be carried out after process feature F10. Process feature F20 may also be carried out before process feature F10. In case of repetitions of process feature F20, process feature F10 may be carried out between process features F20.

Figure 2:
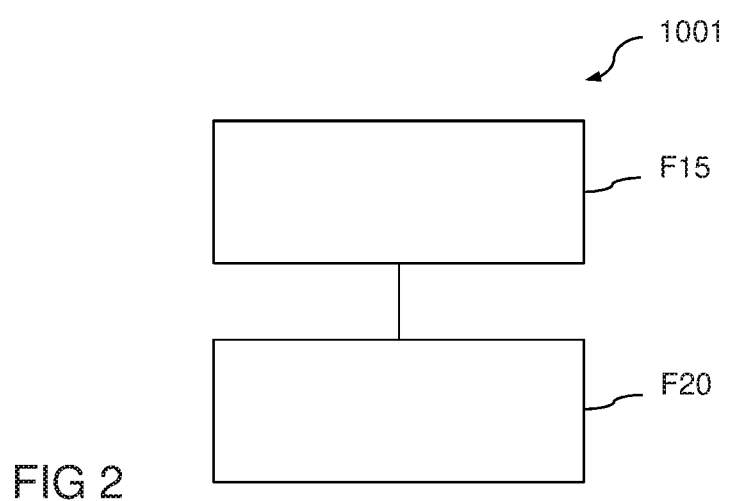
FIG. 2 is a simplified flow-chart for illustrating another method of manufacturing a semiconductor device.

FIG. 2 is a schematic flow-chart for illustrating another method 1001 for manufacturing a semiconductor device.

It will be appreciated that while method 1001 is illustrated and described below as a series of steps or events, the illustrated ordering of such steps or events are not to be interpreted in a limiting sense. For example, some steps may occur in different orders and/or concurrently with other steps or events apart from those illustrated and/or described herein. In addition, not all steps may be required to implement one or more aspects of embodiments of the disclosure herein. Also, one or more of the steps depicted herein may be divided in one or more separate sub-steps and/or phases.

Referring to FIG. 2, process feature F15 comprises forming a doped region in a semiconductor substrate. In one or more embodiments, the doped region is formed at a first side of the semiconductor substrate by introducing dopants through a surface at the first side. The doped region may be formed by masked or unmasked doping processes, for example by doping processes such as ion implantation, diffusion out of a diffusion source or in-situ doping. The doped region may be a body region, a source region, a highly doped body contact regions, a channel implant region of transistors such as IGBTs, an anode or a cathode region of a diode, an edge termination structure such as a variation of lateral doping (VLD) region or a junction termination extension (JTE) region, a guard ring, or a channel stopper. Process feature F15 may further comprise processing the semiconductor substrate at the first side by, for example, processes for forming insulating regions, for example thermal oxidation processes, thermal nitridation processes, dielectric layer deposition processes such as chemical vapor deposition (CVD), low-pressure chemical vapor deposition (LPCVD), plasma enhanced chemical vapor deposition (PEPCVD), atmospheric pressure chemical vapor deposition (APCVD), sub-atmospheric pressure chemical vapor deposition (SACVD) and high density plasma chemical vapor deposition (HDP CVD). Exemplary insulating regions are gate insulating layers, for example thermal oxides or nitrides or high-k and low-k dielectrics, field insulating layers, for example field oxide layers, insulating interlayers, for example deposited oxides such as tetraethyl orthosilicate glass (TEOS), borophosphosilicate glass (BPSG), borosilicate glass (BSG), phosphosilicate glass (PSG), device insulating layers, for example local oxidation of silicon (LOCOS) or trench insulations. Processing the semiconductor body at the first side may further include processes for forming conductive regions, for example physical vapor deposition (PVD) of materials such as metals and metal compounds, chemical vapor deposition (CVD) of materials such as doped polycrystalline silicon or tungsten and electro-chemical deposition (ECD) of materials such as copper. Exemplary conductive regions are gate electrodes, conducting paths of wiring levels, bond pads, vias and contacts. Processing the semiconductor body at the first surface may further include processes for removing material from the first surface, for example etch processes or abrasive machining such as grinding or polishing, and chemical-mechanical polishing (CMP). Exemplary structures resulting from material removal are trenches, for example gate trenches, or field trenches or trenches of trench isolations, contact holes.

Referring to FIG. 2, process feature F20 is carried out as described with reference to FIG. 1.

In one or more embodiments, changing the ion acceleration energy comprises controlling a temporal change of the acceleration energy dE/dt depending on a value of a measured ion beam current density $I_{B,meas}$. The ion beam current density $I_{B,meas}$ may be measured by an ion current detector unit, for example by a Faraday cup. By taking the measured ion beam current density $I_{B,meas}$ into account, the temporal change of the ion acceleration energy dE/dt normalized to the ion beam current density may be the control variable, thereby allowing for counteracting variations in ion beam current density. This is beneficial with respect to achieving a desired local implant dose, i.e. an implant dose at a certain implant depth regardless of variations in the ion beam current density.

In one or more embodiments, changing the ion acceleration energy comprises controlling a temporal change of the acceleration energy dE/dt depending on a value of a measured total implant dose Dint. When controlling the temporal change of the acceleration energy dE/dt at a certain time tref, the measured total implant dose Dint corresponds to the overall implanted dose from the beginning of the ion implantation process, for example t=0s up to the time tref.

In one or more embodiments, the method further comprises converting a target doping concentration versus depth $D_L(x_p)$, $x_p(E)$ being a projected range of dopants depending on implantation or ion acceleration energy, into a target temporal change of the ion acceleration energy normalized to the ion beam current density dE/dt(E) $(I_{B,norm})_{set}$=dE/dt(E)/$I_{B,expected}$, $I_{B,expected}$ being an expected ion beam current density. The target doping concentration versus depth $D_L(x_p)$ may be a desired doping profile to be realized by ion implantation. Ion implantation processes at a fixed ion implantation or acceleration energy may have to be carried out a plurality of times for realizing the target doping concentration versus depth $D_L(x_p)$. This may require additional effort and costs in view of tuning cycles between subsequent ion implantation processes for altering implant recipes. By controlling the temporal change of the ion acceleration energy dE/dt depending on a value of the measured ion beam current density $I_{B,meas}$, the target doping concentration versus depth $D_L(x_p)$ may be realized by a single ion implantation process based on a single implant recipe. The expected ion beam current density $I_{B,expected}$ may be calculated taking into account parameters set in the implant recipe, for example a local dose to be introduced at an initial ion acceleration energy.

In one or more embodiments, the temporal change of the ion acceleration energy dE/dt may be controlled within an ion acceleration energy window $\Delta E = E_2 - E_1$, wherein values of an initial ion acceleration energy $E_1$ and a final ion acceleration energy $E_2$ may be determined depending on the target doping concentration versus depth $D_L(x_p)$. By way of example, the greater the depth range of dopants to be introduced is, the greater the ion acceleration energy window $\Delta E$ is. Likewise, the greater the target doping concentration at a certain depth is, the smaller the temporal change of the ion acceleration energy dE/dt is.

In one or more embodiments, controlling the temporal change of the ion acceleration energy dE/dt depending on the measured ion beam current density $I_{B,meas}$ further comprises comparing, at an ion acceleration energy E, a target temporal change of the ion acceleration energy normalized to the ion beam current density dE/dt $(I_{B,norm})_{set}$=dE/dt$_{target}$/$I_{B,expected}$, $I_{B,expected}$ being an expected beam current, with a set temporal change of ion acceleration energy normalized to the measured ion beam current density $I_{B,meas}$, dE/dt$_{set}$/$I_{B,meas}$. When the temporal change of the ion acceleration energy dE/dt normalized to the ion beam current density is the control variable, a closed loop control unit has a feedback loop which ensures the control unit exerts a control action to give an actual process output, i.e. the set temporal change of ion acceleration energy normalized to the measured ion beam current density dE/dt$_{set}$/$I_{B,meas}$ the same as the so-called reference input or set point, i.e. dE/dt$_{target}$/$I_{B,expected}$, $I_{B,expected}$. For this reason, the closed loop control unit acts as a feedback control unit. By way of example, assuming that the ion beam current density drops due to fluctuations during an ion implantation process, the control unit will counteract this drop by decreasing the set value of dE/dt, thereby bringing the actual temporal change of ion acceleration energy normalized to the measured ion beam current density, i.e. dE/dt$_{set}$/$I_{B,meas}$ closer to the target temporal change of the ion acceleration energy normalized to the ion beam current density dE/dt $(I_{B,norm})_{set}$=dE/dt$_{target}$/$I_{B,expected}$, $I_{B,expected}$.

The control process therefore allows for counteracting variations in ion beam current density, for example proton beam current density while realizing a target doping concentration profile in the semiconductor body based on a single ion implantation recipe. This is not only beneficial with respect to achieving a desired local implant dose, i.e. an implant dose at a certain implant depth regardless of variations in ion beam current density, but also beneficial with regard to ion implantation process simplicity by reducing effort and cost of tuning cycles that are necessary when realizing the target doping profile by a plurality of separate ion implantation processes at different ion acceleration or implantation energies, i.e. each one of the plurality of separate ion implantation processes beings based on a separate implant recipe.

In one or more embodiments, the relative movement between the semiconductor substrate and the ion beam impinging on the surface of the semiconductor substrate is effected by deflecting the ion beam along a first scan direction and along a second scan direction. The relative movement along the first scan direction, for example an x-direction may be effected by electrostatic field scanning. Likewise, the relative movement along the second scan direction, for example a y-direction may also be effected by electrostatic field scanning.

In one or more embodiments, the relative movement between the semiconductor substrate and the ion beam impinging on the surface of the semiconductor substrate is effected by deflecting the ion beam along a first scan direction and by mechanically moving the semiconductor substrate along a second scan direction. The relative movement along the first scan direction, for example an x-direction may be effected by electrostatic field scanning. The relative movement along the second scan direction, for example a y-direction may comprise placing the semiconductor substrate on a substrate carrier of a rotating unit and rotating the substrate carrier. A plurality of semiconductor substrates, for example more than 3, or more than 5, or more than 7, or more than 9, or more than 11, and less than 17, or less than 15, or less than 13 wafers may be placed on the substrate carrier, for example a spinning disc or a spinning wheel.

In one or more embodiments, a scanning speed of the relative movement between the semiconductor substrate and the ion beam along each of the first scan direction and the second scan direction ranges between 10 m/s to 30 km/s. Hence, regardless of whether the relative movement between the semiconductor structure and the ion beam is effected by ion beam deflection along both scan directions or by a combination of ion beam deflection and fast mechanical scanning, a fast scan speed is achieved compared with rather slow scan speeds of mechanical scan systems that are in the range of cm/s.

In one or more embodiments, the method further comprises, while effecting a relative movement between the semiconductor substrate and the ion beam impinging on the surface of the semiconductor substrate, setting input parameters of units for focusing or deflecting the ion beam based on a function $f(E)=\Sigma_{i=0}^{n} a_i E^i$, n being an integer larger than two. The function $f(E)$ may also include half-integral exponents, for example $f(E)=\Sigma_{i=0}^{n} a_i E^i + \Sigma_{i=0}^{m} b_i E^{i+1/2}$, n and m being integers larger than two. For each ion implantation or acceleration energy E(t) that is set while sweeping the ion acceleration energy window $\Delta E = E_2 - E_1$, an input parameter $p_m$, m being an identifier of the input parameter, for example a voltage or a current of a focusing or a deflecting unit of an ion implantation apparatus is set by the function $f_m(E) \Sigma_{i=0}^{n} a_i E^i$. Thus, the input parameters $p_m$ of the focusing or deflecting units are continuously updated during the ion implantation process that is based on a single implant recipe.

In one or more embodiments, the ion beam is a proton beam. This may allow for setting doping concentration profiles of hydrogen-related donors by proton irradiation and annealing with profiles having a Full Width at Half Maximum, FWHM, of at least one peak in the concentration profile of the hydrogen related donors larger than 5 μm, or even larger than 7 μm, or even larger than 10 μm. The full width at half maximum, FWHM is a parameter commonly used to describe the width of a "bump" on a curve or function such as the doping concentration profiles of hydrogen-related donor. It is given by the distance between points on the curve at which the function reaches half its maximum value, i.e. at which the doping concentration of hydrogen-related donors reaches half of its peak value. The distance refers to a vertical distance along a vertical direction, for example along an ion implant direction or perpendicular to a main surface of the semiconductor substrate. In one or more embodiments, drift zones or field stop zones may be manufactured that include profiles of hydrogen-related donors having a Full Width at Half Maximum, FWHM, of at least one peak, or several peaks or all peaks in the concentration profile of the hydrogen related donors larger than 5 μm, or even larger than 7 μm, or even larger than 10 μm. Profiles manufactured by proton implantation and annealing at several discrete proton implantation energies typically result in end-of-range peaks having a FWHM of less than 5 μm, or even less than 4 μm, or even less than 3 μm.

In one or more embodiments, changing an ion acceleration energy of an ion beam while effecting a relative movement between the semiconductor substrate and an ion beam impinging on the semiconductor substrate is carried out with respect to an ion beam impinging on a first side of the semiconductor substrate and with respect to an ion beam impinging on a second side of the semiconductor substrate opposite to the first side. This may allow for a precise setting of a doping concentration and a doping concentration profile in a drift zone of the semiconductor device, for example.

Figure 3:
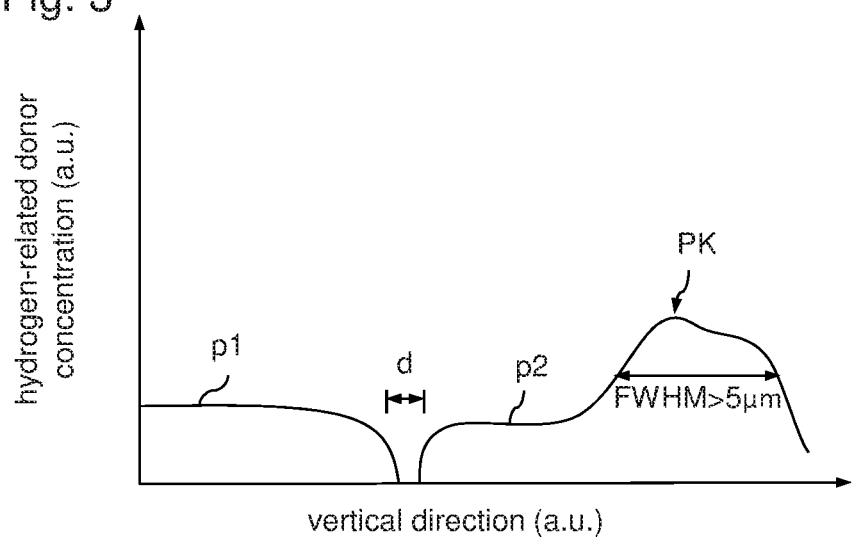
FIG. 3 is a schematic graph illustrating a concentration profile of hydrogen-related donors.

In one or more embodiments, the method 1000 or the method 1001 further comprise reducing a thickness of the semiconductor substrate to a target thickness by removing material of the semiconductor substrate from a surface of the semiconductor substrate at the second side. In addition, the method 1000 or the method 1001 further comprise adjusting a maximum acceleration energy of the ion beam impinging on the second side depending on the target thickness. This may allow for avoiding an overlap of concentration profiles of dopants that have been introduced from opposite sides of the semiconductor substrate, for example. In one or more embodiments, the ion beam impinging on the first side results in a first proton or hydrogen-related donor profile in the semiconductor substrate and the ion beam impinging on the second side results in a second proton or hydrogen-related donor profile in the semiconductor substrate, and wherein a vertical distance between the first and the second proton profile is smaller than 5 μm, or a vertical overlap between the first and the second proton profile is smaller than 5 μm. The embodiment is exemplified in the schematic graph of FIG. 3 illustrating a profile of hydrogen-related donors versus a vertical direction. The ion beam impinging on the first side results in a first hydrogen-related donor profile p1 and the ion beam impinging on the second side results in a second hydrogen-related donor profile p2. A vertical distance d between the first profile p1 and the second profile p2 is smaller than 5 μm. The profiles p1 and p2 may also overlap up to a vertical overlap of less than 5 μm, for example. A Full Width at Half Maximum, FWHM, of a peak PK in the concentration profile p2 of the hydrogen related donors is larger than 5 μm.

In one or more embodiments, a drift zone is formed by changing anion acceleration energy of an ion beam while effecting a relative movement between the semiconductor substrate and an ion beam impinging on the semiconductor substrate.

In one or more embodiments, a field stop zone is formed by changing an ion acceleration energy of an ion beam while effecting a relative movement between the semiconductor substrate and an ion beam impinging on the semiconductor substrate.

In one or more embodiments, changing an ion acceleration energy of an ion beam while effecting a relative movement between the semiconductor substrate and an ion beam impinging on the semiconductor substrate is carried out after performing all other process steps for introducing dopants into the semiconductor substrate. Thus, the ion beam may be used as a final doping process of the semiconductor substrate, for example in view of thermal budget constraints when doping by hydrogen-related donors, for example.

In one or more embodiments, after changing an ion acceleration energy of an ion beam while effecting a relative movement between the semiconductor substrate and an ion beam impinging on the semiconductor substrate, a thermal heating process of the semiconductor substrate is limited to temperatures up to 420° C. and an overall duration up to 4 h. The temperatures may also be limited to smaller values, for example 400° C., or 380° C., or 350° C. Likewise, the overall duration may also be limited to smaller values, for example 60 min, or 600s, or 60s. In one or more embodiments, the thermal budget defined by a product of heating temperature and duration may be limited to values up to 1600° Ch, or up to 400° Ch, or up to 200° Ch.

The above embodiments allow for an improved setting of doping profiles that are based on proton implantation, for example. Since the proton implantation at varying ion acceleration energies of the proton beam allows to dispense with a subsequent diffusion process of hydrogen, the thermal budget may be lowered, for example to minimum annealing temperatures in the range of 350° C. to 380° C. and to minimum annealing durations in the range of 10 minutes to 60 minutes or even in the range of seconds that are typical for rapid thermal annealing (RTP). Thus, thermal annealing parameters may be chosen in view of requirements on i) long-term stability caused by heating during an operation mode of the finalized device, and ii) maximum tolerable concentrations of irradiation defects that are stable at low temperatures, for example in view of comparatively small annealing temperatures and proton implantation from opposites sides of the semiconductor substrate, and further in view of obsolete diffusion of hydrogen and vacancies, target doping concentrations may be manufactured by comparatively small proton implantation doses.

The methods 1000 and 1001 may further allow for an improved predictability of final doping, for example. In view of the reduction of the thermal budget for annealing/activating hydrogen-related donors based on proton implantation described with reference to methods 1000, 1001, higher voltage classes of semiconductor devices, for example 1700 V voltage class IGBTs may be manufactured since the formation of oxygen-related donors, which occurs essentially in the temperature range between 400° C. and 500° C., can be effectively avoided. When forming a basic doping in the semiconductor device by proton irradiation, for example a drift zone doping, a first proton irradiation at varying ion acceleration energy may be first carried out through a surface at the first side of the semiconductor substrate before thinning. Further, a second proton irradiation at varying ion acceleration energy may be carried out through a surface at the second side of the semiconductor substrate after thinning the semiconductor substrate to a target thickness. Both proton irradiations may be carried out based on maximum ion acceleration energies smaller than 2.6 MeV being a threshold for neutron generation. Thereby, radiation protection measures may be dispensed with, for example.

Figure 4:
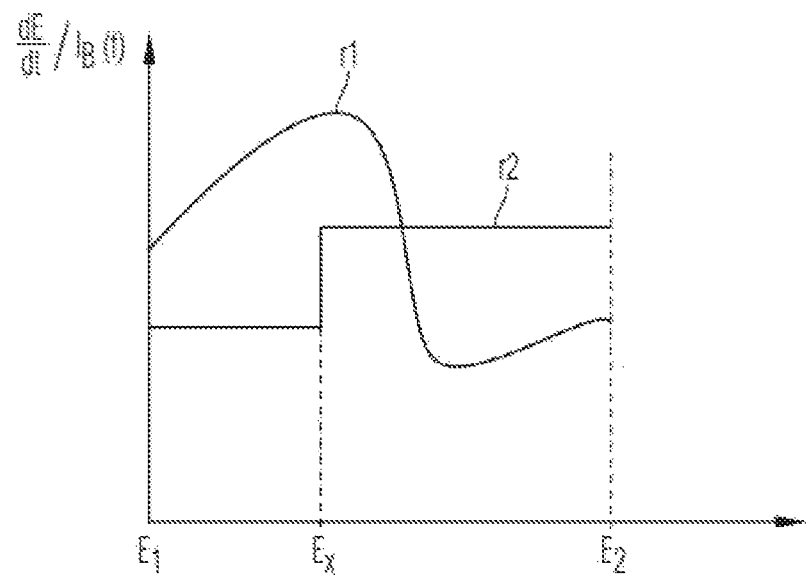
FIG. 4 is a schematic graph for illustrating curves r1, r2 of a temporal change of the ion acceleration or implantation energy normalized to the ion beam current density dE/dt/Ib (t) versus the ion acceleration or implantation energy with respect to an energy window $\Delta E = E_2 - E_1$.

Referring to the schematic graph of FIG. 4, schematic curves r1, r2 of a temporal change of the ion acceleration energy normalized to the ion beam current density $dE/dt/I_B$ (t) versus ion acceleration energy are illustrated with respect to the ion acceleration energy window $\Delta E = E_2 - E_1$, wherein values of an initial ion acceleration energy $E_1$ and a final ion acceleration energy $E_2$ may be determined depending on the target doping concentration versus depth $D_L(X_p)$ that is to be formed. The temporal change of the ion acceleration energy normalized to the measured ion beam current density $dE/dt/I_B(t)$ may correspond to the reference input of the control unit, i.e. $dE/dt_{target}/I_{B,expected}$. Curve r1 is associated with a target doping profile having a steep decrease in doping concentration at a depth corresponding to a projected range at an ion implantation or acceleration energy Ex, whereas curve r2 is associated with a target doping profile having a doping concentration minimum located between a doping concentration maximum and a surface from where dopants enter the semiconductor substrate by the ion implantation process.

Figure 5A:
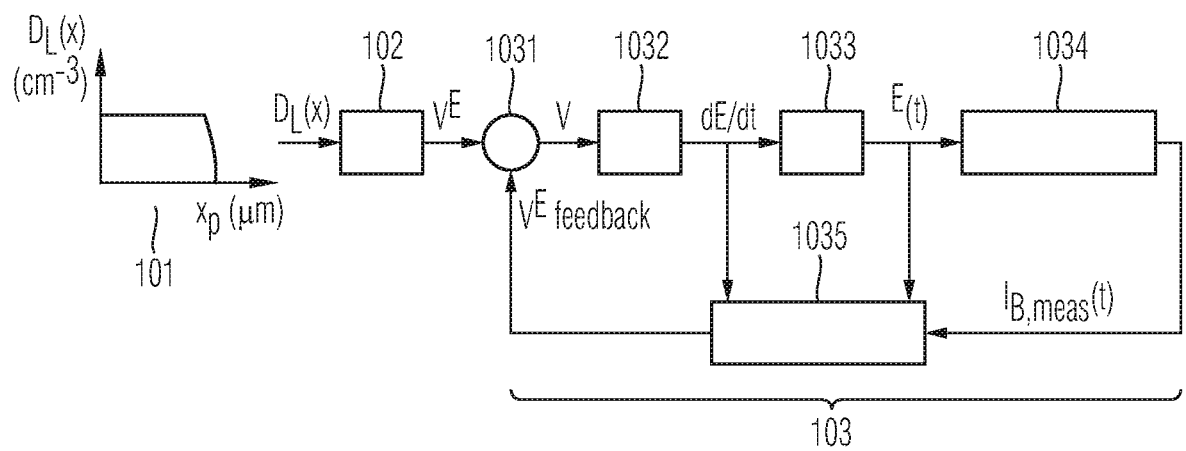
FIGS. 5A and 5B are schematic block diagrams for illustrating a closed-loop control process of the temporal change of the ion implantation or acceleration energy normalized to the measured ion beam current density $dE/dt/I_B$ (t).
Figure 5B:
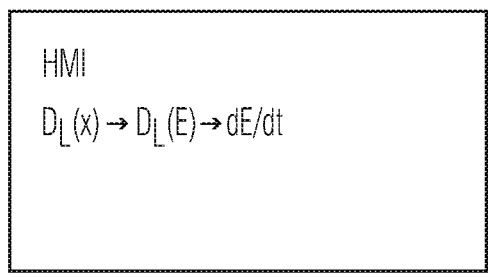

Referring to the schematic diagrams of FIGS. 5A and 5B, a closed-loop control process of the temporal change of the ion acceleration energy normalized to the measured ion beam current density $dE/dt/I_B(t)$ is illustrated. At process phase 101, a target doping concentration profile $D_L(x)$ is specified, for example by semiconductor process simulation based on TCAD (Technology Computer Aided Design) simulation tools. The target doping concentration profile $D_L(x)$ may then be input to a human machine interface (HMI) or conversion unit 102 that is illustrated in more detail in FIG. 5B. The HMI unit 102 converts the target doping concentration versus depth $D_L(X)$ into a target doping concentration versus energy $D_L(E)$, and the target doping concentration versus energy $D_L(E)$ into a temporal ion acceleration or implantation energy dE/dt by taking a functional dependence E(x) between the implantation energy E and corresponding projected range x into account. This conversion by the HMI unit 102 may be based on dopant-specific experimental and/or simulation data of profile parameters such as, for example projected range, longitudinal straggle, skewness or kurtosis.

The HMI unit 102 outputs a target temporal change of the ion acceleration energy normalized to the ion beam current density $V^E_{target} = dE/dt_{target}/I_{B,expected}$ that is input into a closed-loop control unit 103 as a reference input. An automatic controller unit 1031 that may include an error detector and an amplifier compares the actual value of the temporal change of the ion acceleration energy normalized to the measured ion beam current density, i.e. $V^E_{feedback} = dE/dt_{set}/I_{B,meas}$ with the reference input, i.e. the target value $V^E_{target} = dE/dt_{target}/I_{B,expected}$, determines the deviation, and generates a control signal c that will reduce the deviation between $V^E_{feedback}$ and $V^E_{target}$. If $V^E_{feedback}$ is greater than $V^E_{target}$, the control signal may cause a decrease of dE/dt for increasing a local dose at a certain implant depth.

Likewise, if $V^E_{feedback}$ is smaller than $V^E_{target}$, the control signal c may cause an increase of dE/dt for decreasing a local dose at a certain implant depth. The control signal c of the automatic controller unit 1031 is output to an actuator unit 1032 that determines the temporal change of the ion acceleration or implantation energy dE/dt according to the control signal c so that $V^E_{feedback}$ will approach $V^E_{target}$. The temporal change of the ion acceleration energy dE/dt is the output from the actuator unit 1032 to an integration unit 1033 that determines the actual ion acceleration energy E(t). The actual ion acceleration energy E(t) is the output from the integration unit 1033 to units of an ion implantation apparatus part 1034 that are operated based on the ion acceleration energy E(t), for example acceleration unit(s), focusing unit(s) or deflection unit(s). A feedback control unit 1035 receives, as an input signal, a measured value of the ion beam current density $I_{B,meas}(t)$. The ion beam current density $I_{B,meas}(t)$ may be measured by an ion current detector unit, for example by a Faraday cup being part of the ion implantation apparatus part 1034. The feedback control unit 1035 further receives the actual temporal change of ion acceleration energy $dE_{set}/dt$ and determines $V^E_{feedback}$. The value $V^E_{feedback}$ is then output to the automatic controller unit 1031, thereby closing the feedback loop.

Figure 5C:
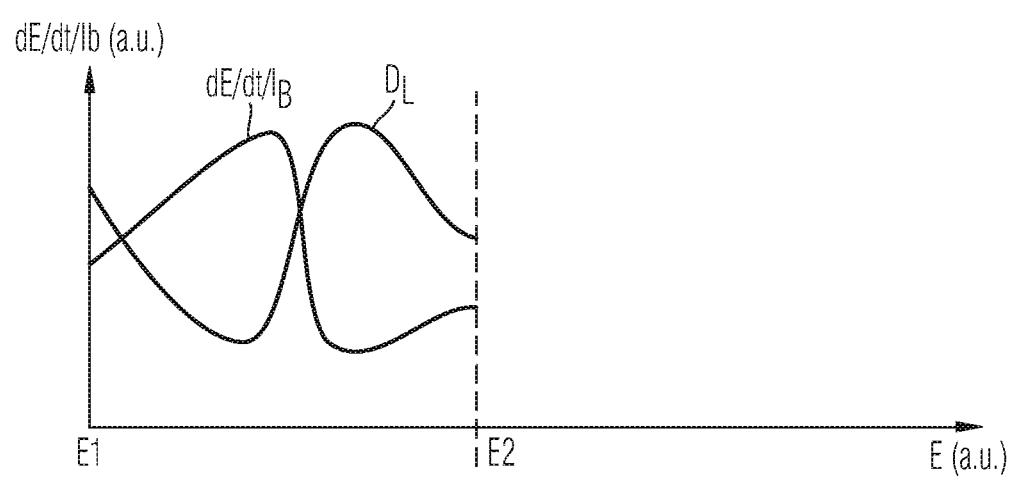
FIG. 5C is a schematic graph for illustrating a relation between a temporal change of the ion acceleration energy normalized to the ion beam current density $dE/dt/I_B(t)$ versus ion acceleration energy and the doping concentration versus ion acceleration energy.

FIG. 5C is a graph for illustrating a relation between a temporal change of the ion acceleration energy normalized to the ion beam current density $dE/dt/I_B(t)$ versus ion acceleration energy and the doping concentration versus ion acceleration energy $D_L(E)$. The illustration is simplified as it is, inter alia, based on a linear relationship between the projected range x and ion acceleration energy E.

FIG. 6 shows an ion implantation apparatus 200 including an ion source 205 generating and emitting ions, for example, protons, helium or ions with an atomic number greater 4, for example ions of nitrogen, aluminum, boron, phosphorus, arsenic, sulfur, selenium, germanium, or oxygen. An acceleration unit 220 may accelerate a selected type of ions and may filter out others. A collimator unit 230 may align the directions of motion of the ions in a direction parallel to a beam axis and may direct a collimated ion beam 235 onto a semiconductor substrate 240, which may be temporarily fixed, e.g. by vacuum on a substrate carrier 245. In a plane orthogonal to the beam axis an ion distribution in the collimated ion beam 235 may be point-symmetric to a beam center.

A cross-sectional area of the ion beam 235 may be in the order from few hundred square micrometers to few square centimeters. A scanning assembly 250 scans the ion beam 235 along a beam track over a main surface of the semiconductor substrate 240 to distribute the ions uniformly across the semiconductor substrate 240. The beam track may include straight sections, zig-zag patterns, may form circles, may form a spiral or any other typical scan pattern.

The scanning assembly 250 controls the scan by electrostatic fields, wherein the scanning assembly 250 controls a relative movement between the ion beam 235 and the semiconductor substrate 240 along a first scan direction x and along a second scan direction y. The first and second scan directions x, y may be perpendicular to one another, for example. In the embodiment illustrated in FIG. 6, the scanning assembly 250 includes a first deflection sub-unit 251 for deflecting the ion beam 235 along the first scan direction x. The ion beam 235 traverses a region between a pair of first deflection electrodes deflecting the ion beam 235 along the first scan direction x. Then the ion beam passes a pair of second deflection electrodes of a second deflection sub-unit 252 deflecting the ion beam 235 along a linear second scan direction y that may be orthogonal to the drawing plane. The electric fields in the first and second deflection sub-units 251, 252 sweep the ion beam 235 across the complete main surface of the semiconductor substrate 240.

The ion implantation apparatus 200 further includes a control unit 260 configured to change an ion acceleration energy E of the ion beam 235 during the relative movement between the semiconductor substrate 240 and the ion beam 235 impinging on a surface of the semiconductor substrate 240. The control unit 260 may control the change of the ion acceleration energy normalized to the ion beam current density $dE/dt/I_B$ as described with reference to the embodiments above, for example. The control unit 260 may output the ion acceleration or implantation energy E(t) to units of the ion implantation apparatus 200, for example to the acceleration unit 220, to the collimator unit 230 and to the first and second deflection sub-units 251, 252. The ion beam current density $I_B(t)$ may be measured by one or more ion current detector units, for example by Faraday cups close to the semiconductor substrate 240 at the substrate carrier 245. The measured ion beam current density $I_{B,meas}(t)$ is output to the control unit 260.

Figure 7:
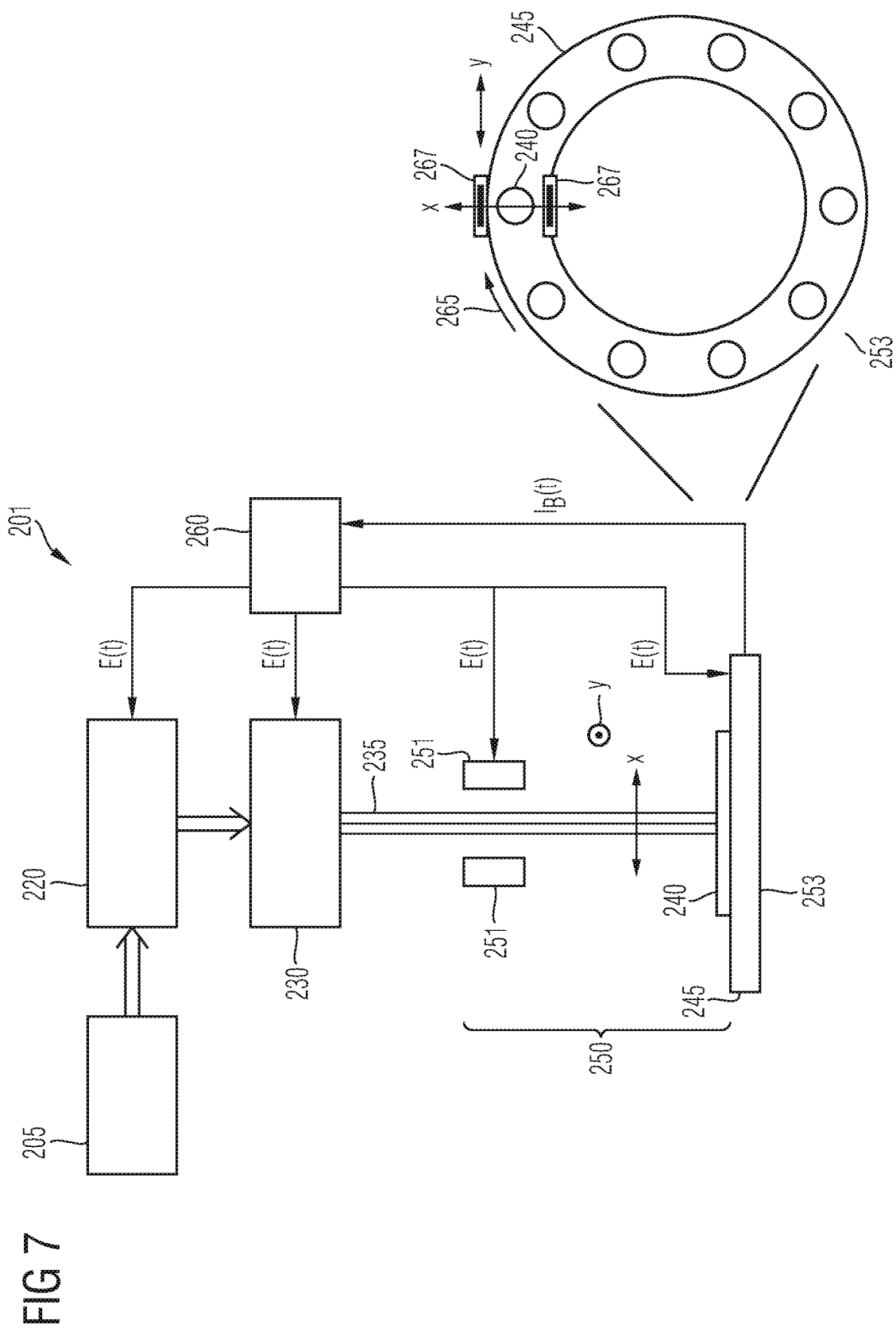
FIG. 7 is a schematic illustration of an ion implantation apparatus based on both electrostatic and mechanical scanning.

FIG. 7 shows an ion implantation apparatus 201 including the ion source 205, the acceleration unit 220, the collimator unit 230 and the control unit 260 as described with reference to the ion implantation apparatus 200 illustrated in FIG. 6. Other than the ion implantation apparatus 200 of FIG. 6, the ion implantation apparatus 201 is based on both electrostatic scanning and mechanical scanning. Electrostatic scanning along the first scan direction x is effected by the first deflection sub-unit 251 of the scanning assembly 250. Scanning along the second scan direction y is effected by moving the semiconductor substrate 240 relative to the ion beam 235 along the second scan direction y caused by a rotation of the substrate carrier 245. The substrate carrier 245 may be part of a rotating unit 253. In one or more embodiments, the substrate carrier 245 is disc-like or wheel-like and configured to hold a number of semiconductor substrates, for example by vacuum. Rotating the substrate carrier 245 along a radial direction 265 effects the relative movement between semiconductor substrate 240 and the ion beam 235 along the second scan direction y. A rotation speed of the rotating unit 253 may be in the range of hundreds or thousands of rpm, thereby achieving a fast scan with scan speeds of more than 10 m/s, or even more than 100 m/s. Ion current detector units 267 may be arranged on the substrate carrier 245 for measuring the ion beam current density $I_{B,meas}(t)$ that is output to the control unit 260. The Ion current detector units 267 may intersect an ion beam path along the first direction x.

Figure 8:
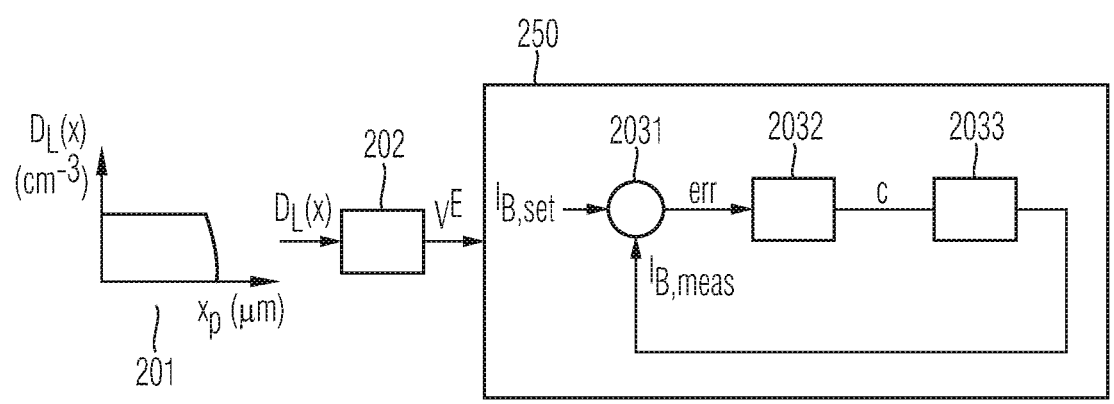
FIG. 8 is a schematic block diagram for illustrating a closed-loop control process of the ion beam current density.

Referring to the schematic diagrams of FIG. 8, an open-loop control process of the temporal change of the ion acceleration energy normalized to a set ion beam current density $dE/dt/I_{B,set}$ in combination with a closed-loop control process of the ion beam current density is illustrated. At process phase 201, a target doping concentration profile $D_L(X)$ is specified, for example by semiconductor process simulation based on TCAD (Technology Computer Aided Design) simulation tools. The target doping concentration profile $D_L(x)$ may then be input to a human machine interface (HMI) or conversion unit 202. The HMI unit 202 converts the target doping concentration versus depth $D_L(x)$ into a target doping concentration versus energy $D_L(E)$, and the target doping concentration versus energy $D_L(E)$ into a temporal change of the ion acceleration or implantation energy $dE/dt$ by taking a functional dependence $E(x)$ between the implantation energy E and corresponding projected range x into account.

This conversion by the HMI unit 202 may be based on dopant-specific experimental and/or simulation data of profile parameters such as, for example projected range, longitudinal straggle, skewness or kurtosis. The HMI unit 202 outputs a target temporal change of the ion acceleration energy normalized to a set ion beam current density $V^E=dE/dt/I_{B,set}$ that is input into a beamline system 250. In the beamline system 250, the set ion beam current density undergoes a closed-loop control process. A comparator unit 2031 that may include an error detector and an amplifier compares the actual value of the ion beam current density $I_{B,meas}$ with the reference input, i.e. $I_{B,set}$, determines the deviation, and generates an error signal err as the input signal to an automatic controller 2032, e.g. PID Controller, that generates a control signal c according to the error signal err so that $I_{B,meas}$ will approach $I_{B,set}$. A beam current regulator unit 2033 receives the control signal c as an input signal for adjusting the beam current. The ion beam current density $I_{B,meas}$ may be measured by an ion current detector unit, for example by a Faraday cup being part of the ion implantation apparatus and input to the comparator unit 2031, thereby achieving the closed-loop control of the ion beam current density while controlling the temporal change of the ion acceleration or implantation energy $dE/dt$ by an open-loop process.

The ion implantation method and the ion implantation apparatus described above may be used to manufacture semiconductor devices, for example field effect transistors (FETs), insulated gate bipolar transistors (IGBTs) or diodes in any kind of semiconductor substrate material, for example silicon (Si), silicon carbide (SiC), silicon germanium (SiGe), germanium (Ge), gallium arsenide (GaAs), gallium nitride (GaN).

The methods 1000, 1001 described above may be used for manufacturing of field stop zones in silicon substrates by proton implantation. Instead of multiple ion implantations at different implant energies based on different implant recipes, a single ion implantation process may be sufficient. Likewise drift zone doping in SiC may be realized by a single ion implantation process. In low-voltage Si semiconductor devices drift zone doping and body doping may be realized by a single ion implantation process, in medium and high voltage Si or SiC semiconductor devices, a single ion implantation process may be carried out between successive layer depositions, for example. In Si and SiC semiconductor devices, super junction structures may be realized having a constant or almost constant doping concentration versus depth. Also deep doping regions at a rear side of a semiconductor substrate may be realized based on a low thermal budget that may be required for rear side processing in view of thermal budget constraints due to finished front side structures, for example.

According to an embodiment, a semiconductor device comprises a semiconductor substrate and a field stop zone in the semiconductor substrate. A doping concentration profile of the field stop zone is determined by a concentration profile of hydrogen-related donors, and the concentration profile of the hydrogen-related donors has a Full Width at Half Maximum, FWHM, of at least one peak, or several peaks or all peaks in the concentration profile of the hydrogen related donors larger than 5 µm, or even larger than 7 µm, or even larger than 10 µm. The full width at half maximum, FWHM is a parameter commonly used to describe the width of a "bump" on a curve or function such as the doping concentration profiles of hydrogen-related donor. It is given by the distance between points on the curve at which the function reaches half its maximum value, i.e. at which the doping concentration of hydrogen-related donors reaches half of its peak value. The distance refers to a vertical distance along a vertical direction, for example along an ion implant direction or perpendicular to a main surface of the semiconductor substrate.

In one or more embodiments, the concentration profile of the field stop zone along a vertical direction is, with respect to any section of an overall vertical extension of the field stop zone, steadily decreasing or constant.

In one or more embodiments, the semiconductor device further comprises a first load terminal contact at a first surface of the semiconductor substrate, a control terminal contact at the first surface of the semiconductor substrate, and a second load terminal contact at a second surface of the semiconductor substrate.

Figure 9:
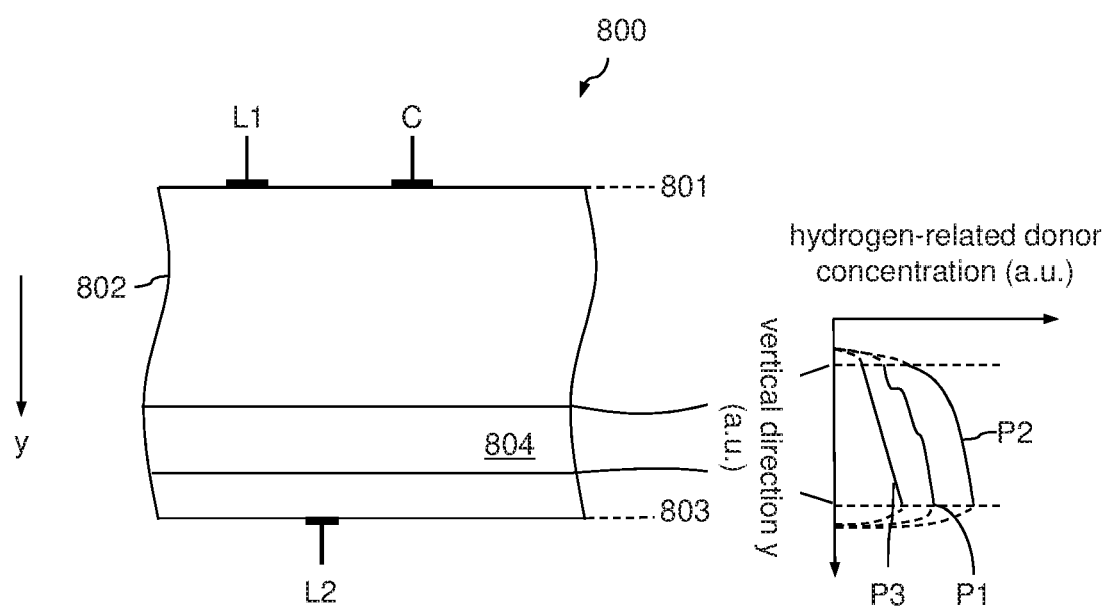
FIG. 9 is a schematic cross-sectional view of a semiconductor device.

FIG. 9 is a schematic cross-sectional view of a semiconductor device 800. Manufacturing the semiconductor device may include the methods 1000 or 1001 described above, for example. The semiconductor device 800 includes a first load terminal L1, for example a source electrode, and a control terminal C, for example a gate electrode at a first surface 801 of a semiconductor substrate 802. The semiconductor device 800 further includes a second load terminal L2, for example a drain electrode at a second surface 803 of the semiconductor substrate 802. The semiconductor device 800 further includes a field stop zone 804. A doping concentration profile in the field stop zone 804 is determined by a concentration profile of hydrogen-related donors. Exemplary profiles illustrated in the graph of FIG. 9 include a stepped profile p1, a Gaussian-like profile p2 and a steadily decreasing profile p3.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of manufacturing a semiconductor device, the method comprising:
   reducing a thickness of a semiconductor substrate and/or forming a doped region in the semiconductor substrate; and
   changing an ion acceleration energy of an ion beam while effecting a relative movement between the semiconductor substrate and the ion beam impinging on the semiconductor substrate,
   wherein changing the ion acceleration energy comprises:
      impinging a first ion beam on a first side of the semiconductor substrate; and
      impinging a second ion beam on a second side of the semiconductor substrate opposite to the first side.

2. The method of claim 1, wherein changing the ion acceleration energy comprises controlling a temporal change of the acceleration energy dE/dt depending on a value of a measured ion beam current density $I_{B,meas}$.

3. The method of claim 2, further comprising:
   converting a target doping concentration versus depth $D_L(x_p)$, $x_p(E)$ being a projected range of dopants depending on the ion acceleration energy, into a target temporal change of the ion acceleration energy normalized to the ion beam current density dE/dt (E) $(I_{B,norm})_{set}$=dE/dt (E)/$I_{B,expected}$, $I_{B,expected}$ being an expected beam current density.

4. The method of claim 2, wherein controlling the temporal change of the acceleration energy dE/dt depending on a value of the measured ion beam current density $I_{B,meas}$ further comprises comparing, at an ion acceleration energy E, a target temporal change of the ion acceleration energy normalized to the ion beam current density dE/dt $(I_{B,norm})_{set}$=dE/dt$_{target}$/$I_{B,expected}$, $I_{B,expected}$ being an expected beam current, with a set temporal change of the ion acceleration energy normalized to $I_{B,meas}$, dE/dt$_{set}$/$I_{B,meas}$.

5. The method of claim 1, wherein the relative movement between the semiconductor substrate and the ion beam impinging on the semiconductor substrate is effected by deflecting the ion beam along a first scan direction and along a second scan direction.

6. The method of claim 5, wherein a scanning speed of the relative movement between the semiconductor substrate and the ion beam along each of the first scan direction and the second scan direction ranges between 10 m/s to 30 km/s.

7. The method of claim 6, further comprising, while effecting a relative movement between the semiconductor substrate and the ion beam impinging on the semiconductor substrate, setting input parameters of units for focusing or deflecting the ion beam based on a function $f(E)=\Sigma_{i=0}^{n} a_i E^i$, n being an integer larger than two.

8. The method of claim 1, wherein the relative movement between the semiconductor substrate and the ion beam impinging on the semiconductor substrate is effected by deflecting the ion beam along a first scan direction and by mechanically moving the semiconductor substrate along a second scan direction.

9. The method of claim 8, wherein mechanically moving the semiconductor substrate along the second scan direction comprises placing the semiconductor substrate on a substrate carrier of a rotating unit and rotating the substrate carrier.

10. The method of claim 1, wherein the ion beam is a proton beam.

11. The method of claim 1, wherein the thickness of the semiconductor substrate is reduced to a target thickness by removing material of the semiconductor substrate from a surface of the semiconductor substrate at a second side, the method further comprising:
adjusting a maximum acceleration energy of the ion beam impinging on the second side depending on the target thickness.

12. The method of claim 1, wherein the first ion beam yields a first proton profile in the semiconductor substrate and the second ion beam yields a second proton profile in the semiconductor substrate, and wherein a vertical distance between the first and the second proton profiles is smaller than 5 μm, or a vertical overlap between the first and the second proton profiles is smaller than 5 μm.

13. The method of claim 1, wherein a field stop zone or a drift zone is formed by changing the ion acceleration energy of the ion beam while effecting a relative movement between the semiconductor substrate and the ion beam impinging on the semiconductor substrate.

14. The method of claim 1, wherein changing the ion acceleration energy of the ion beam while effecting a relative movement between the semiconductor substrate and the ion beam impinging on the semiconductor substrate is carried out after performing all other process steps for introducing dopants into the semiconductor substrate.

15. The method of claim 1, further comprising:
after changing the ion acceleration energy of the ion beam while effecting a relative movement between the semiconductor substrate and the ion beam impinging on the semiconductor substrate, performing a thermal heating process of the semiconductor substrate which is limited to temperatures up to 420° C. and an overall duration up to 4 h.

16. The method of claim 1, wherein changing the ion acceleration energy comprises controlling a temporal change of the acceleration energy depending on a value of a measured total implant dose.

17. A method of manufacturing a semiconductor device, the method comprising:
reducing a thickness of a semiconductor substrate and/or forming a doped region in the semiconductor substrate; and
changing an ion acceleration energy of an ion beam while effecting a relative movement between the semiconductor substrate and the ion beam impinging on the semiconductor substrate, wherein a field stop zone or a drift zone is formed by changing the ion acceleration energy of the ion beam while effecting a relative movement between the semiconductor substrate and the ion beam impinging on the semiconductor substrate.

18. A method of manufacturing a semiconductor device, the method comprising:
reducing a thickness of a semiconductor substrate and/or forming a doped region in the semiconductor substrate; and
changing an ion acceleration energy of an ion beam while effecting a relative movement between the semiconductor substrate and the ion beam impinging on the semiconductor substrate,
wherein changing the ion acceleration energy of the ion beam while effecting a relative movement between the semiconductor substrate and the ion beam impinging on the semiconductor substrate is carried out after performing all other process steps for introducing dopants into the semiconductor substrate.

19. A method of manufacturing a semiconductor device, the method comprising:
reducing a thickness of a semiconductor substrate and/or forming a doped region in the semiconductor substrate;
changing an ion acceleration energy of an ion beam while effecting a relative movement between the semiconductor substrate and the ion beam impinging on the semiconductor substrate; and
after changing the ion acceleration energy of the ion beam while effecting a relative movement between the semiconductor substrate and the ion beam impinging on the semiconductor substrate, performing a thermal heating process of the semiconductor substrate which is limited to temperatures up to 420° C. and an overall duration up to 4 h.

20. A method of manufacturing a semiconductor device, the method comprising:
reducing a thickness of a semiconductor substrate and/or forming a doped region in the semiconductor substrate; and
changing an ion acceleration energy of an ion beam while effecting a relative movement between the semiconductor substrate and the ion beam impinging on the semiconductor substrate,
wherein changing the ion acceleration energy comprises controlling a temporal change of the acceleration energy depending on a value of a measured total implant dose.

\* \* \* \* \*